(12) United States Patent
Vasiliev

(10) Patent No.: US 6,574,774 B1
(45) Date of Patent: Jun. 3, 2003

(54) PHYSICAL BLOCK ADDRESS RECOVERY APPARATUS SYSTEM AND METHOD FOR CYCLIC ERROR CORRECTION CODES

(75) Inventor: Peter I. Vasiliev, Cupertino, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/227,388

(22) Filed: Jan. 8, 1999

Related U.S. Application Data

(60) Provisional application No. 60/070,762, filed on Jan. 8, 1998.

(51) Int. Cl.[7] .......................... H03M 13/00; G06F 11/00
(52) U.S. Cl. ........................................ 714/800; 714/781
(58) Field of Search ................................. 714/800, 801, 714/802, 803, 781; 708/530, 531, 620, 670

(56) References Cited

U.S. PATENT DOCUMENTS

| | | | |
|---|---|---|---|
| 4,608,693 A | * | 8/1986 | Baranyai et al. ............ 714/801 |
| 4,661,956 A | * | 4/1987 | Izumita et al. ............... 714/758 |
| 4,675,736 A | * | 6/1987 | Lehmer et al. ............. 348/747 |
| 5,627,844 A | | 5/1997 | Cho .......................... 371/40.1 |
| 5,896,406 A | * | 4/1999 | Berry et al. ................. 714/801 |

* cited by examiner

Primary Examiner—Christine T. Tu
(74) Attorney, Agent, or Firm—Derek J. Berger; Kirk A. Cesari

(57) ABSTRACT

The invention relates to apparatus and method that provide an improved media codeword and which can distinguish an uncorrectable data error from a wrong block address error and permit the address to be recovered from readback data. In accordance with one embodiment of the invention, method for generating parity is provided in which a sequences representing address and data are received. The address sequence is multiplied by a set of multiplier symbols to generate a first sequence of product symbols. A first portion is added to the data sequence prior to generating a first parity sequence and second portion is added directly to the first parity sequence to generate the final parity sequence. A corresponding method of generating syndromes from readback data is provided. System and apparatus incorporating the inventive method are also provided.

9 Claims, 5 Drawing Sheets

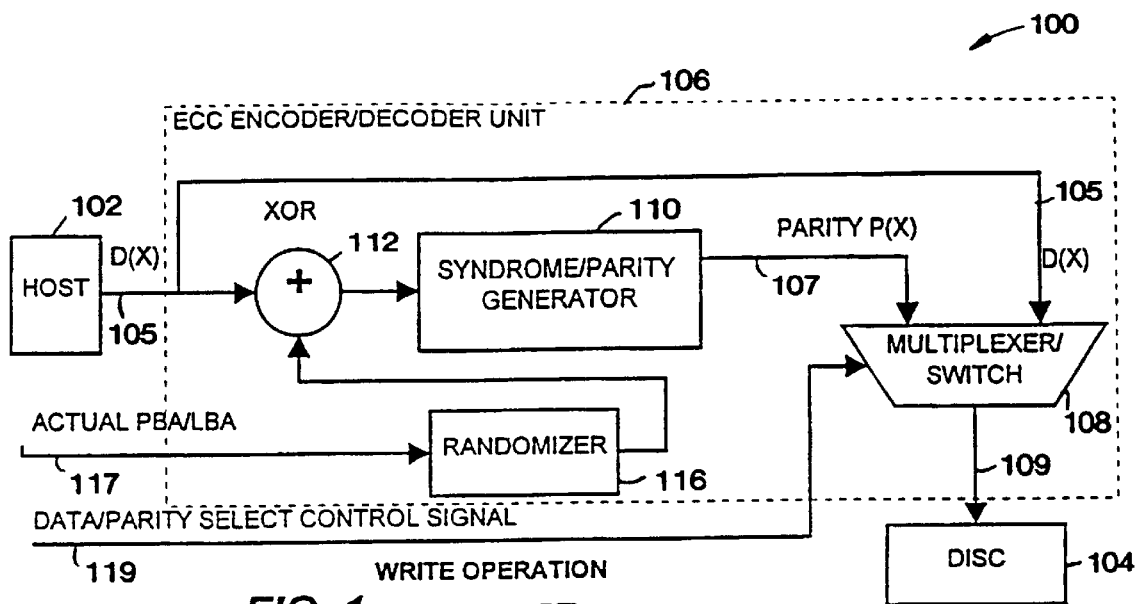
FIG. 1 [PRIOR ART]
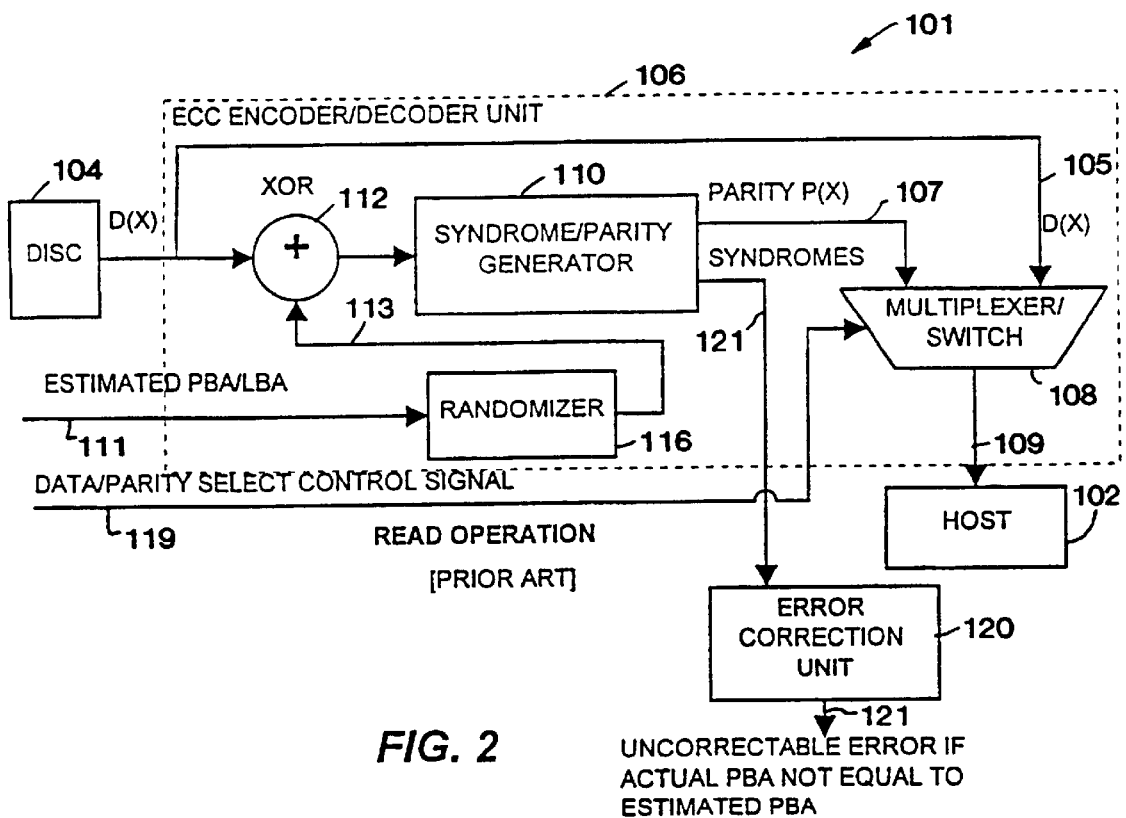
FIG. 2 [PRIOR ART]

Sequential prepending of PBA and data parity
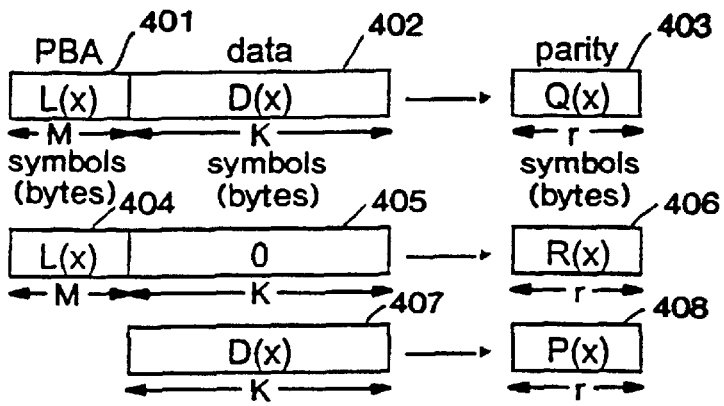
PBA parity and data parity can be separated
S(x) has the length of the data and parity of the prepended PBA
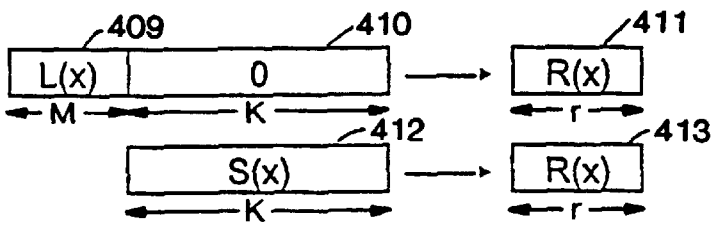
Add S(x) to the data and process the sum to get the same parity as for sequential prepending
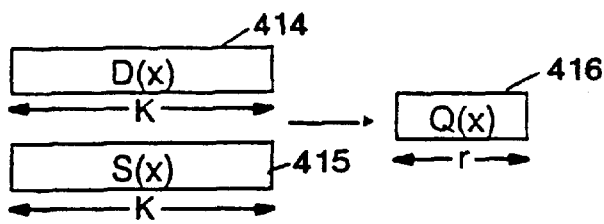
*FIG. 5*

PHYSICAL BLOCK ADDRESS RECOVERY APPARATUS SYSTEM AND METHOD FOR CYCLIC ERROR CORRECTION CODES

CROSS REFERENCE TO RELATED APPLICATIONS

This application claims priority to U.S. Provisional Patent Application Ser. No. 60/070,762 filed Jan. 8, 1998, which application disclosure is hereby incorporated by reference.

FIELD OF THE INVENTION

The present invention relates generally to error detection and/or correction. More particularly, the invention relates to a physical or logical block address (PBA or LBA) transfer and recovery system and method for interleaved Reed-Solomon (RS) codes that can distinguish between a block address error and an uncorrectable data error and that permits recovery of the actual block address in the event of a physical or logical block address error.

BACKGROUND OF THE INVENTION

Since a storage medium is subject to various types of noise, distortion and interference, various errors can occur at the output of the storage medium. The current trend is to store greater amounts of digital data in smaller areas on the storage medium. This trend increases the probability of errors. To correct the errors, error correction coding is used. There are various error correction coding techniques. One class of such error correction codes is the well-known Reed Solomon (RS) codes. The Reed Solomon (RS) encoding technique appends to each block of b user data symbols 2t redundancy symbols to create a codeword (where t represents the designed symbol error correcting capacity of the code). There are b+2t symbols in a RS codeword. The RS codewords are transmitted to and from the storage medium with a certain error probability. During the decoding phase, certain error patterns introduced from the transmission of the data from the storage medium can be detected and the original data reconstructed by analyzing the received data. See, for example, the reference "Error Control Systems for Digital Communication and Storage, by Stephen B. Wicker published 1995 by Prentice Hall, Inc., Englewood Cliffs, N.J. 07632, ISBN 0-13-200809-2, which is hereby incorporated by reference, for a discussion of some conventional error detection and control systems and methods.

Often errors occur in bursts rather than in random patterns, so that several consecutive bytes or symbols are in error. (In this description a symbols are used synonymously with bytes and it is understood that where the term byte is used, the number of bits is arbitrary and is not restricted to 8-bits, 16-bits or the like, but may take on any number of bits, for example 10 bits, 12 bits or other numbers.) If all the errors in such a burst are confined to a single codeword, the error correction coding technique may not be able to correct these errors, since the coding technique's capacity is limited to correcting a predefined number of errors and the error burst may exceed this capacity. Interleaving is often used to overcome this problem. Interleaving is a technique that distributes user data symbols over several codewords so that the symbols from any given codeword are well separated during transmission. When the codewords are reconstructed during the decoding process, error bursts introduced during the transmission are broken up and spread across several codewords. The distribution of the errors in this manner is done so that the number of errors present in a codeword is more likely to be within the capacity of the error correction technique.

Encoded data is stored at a certain physical block address (PBA) on the storage medium. The PBA may also be associated with a particular Logical Block Address (LBA) so that references to PBAs in this discussion also apply to LBAs. Normally, each location on a recording media has a physical block address; however, since recording media such as magnetic discs, magneto-optical discs, magnetic tapes, and the like may have at least some imperfections, the media associated with some physical block addresses may be remapped to some different physical block addresses. Each of the available (error-free) physical block addresses is identified by a logical block address. In traditional systems and devices, the PBA (or LBA) can be used in the encoding/decoding process in such a way that if encoded data is decoded using a different PBA (or LBA), then the decoding process will fail, that is, the data will appear to have uncorrectable errors.

In one traditional approach, a disc drive computer system 100 having a host computer 102, a rotatable magnetic disc drive 104 having one or more discs for storing data thereupon, and a error correction code encoder/decoder unit (ECC encoder/decoder) 106 is provided as illustrated in FIG. 1 for the write or encoder operation. (A corresponding block diagram 101 for the readback or decoder operation is illustrated in FIG. 2 and described in greater detail hereinafter. ECC encoder/decoder 106 provides a first path between host 102 and disc 104 for user data D(x) 105 with only a multiplexer or switch 108 interposed between host 102 and disc 104, for selecting either data D(x) 105 or parity P(x) 107 as the information 109 to be written to disc 104. The manner in which data and parity are written to disc drive storage is well known in the art and not described further here. It is also understood that an actual implementation may include buffers, registers, clock signals, and other logic to implement the circuit, but being conventional are not described in order not to obscure the invention or its differences from traditional systems, devices, or methods.

A second path from host 102 to disc 104 is defined through syndrome/parity generator 110 which receives the output of exclusive-or (XOR) circuit 112 formed by the XOR of data D(x) and the output 113 of randomizer 116. Randomizer 116 receives the actual PBA (or LBA) 117 as a seed to generate a pseudo-random sequence output as is known in the art. Parity/syndrome generator 110 generates parity P(x) on the basis of the sum signal output by XOR 112. Multiplexer 108 selects or passes either data D(x) or parity P(x) in response to the state of a data/parity select control signal 119.

Randomizer unit 116 is important in the operation of the traditional ECC encoder/decoder unit 106 and is seeded with the intended or actual PBA value for writing (encoding) and with the expected or predicted PBA value 111 for readback (decoding). As described previously, the predicted or estimated PBA (or LBA) 111 may for example be a 4-byte value that specifies the location on the storage media, for example the track and sector on a magnetic disc, where the information is expected to be written to or read from. Seeding refers to a procedure for encoding or decoding in which the randomizer is preset with the value of the PBA (or LBA) prior to generating the pseudo-random sequence. The use of a seed to generate a pseudo-random sequence is well known in the art and not described further here.

The output sequence 113 of randomizer 116 is XOR'ed by XOR circuit 112 with the write data D(x) 105 arriving from host 102 for the parity generation during writing, and XOR'ed by XOR 112 with the read data D(x) 105 for the syndrome generation during readback (See FIG. 2 for readback configuration). In the read or readback mode of operation, data D(x) arrives from the disc 104 and is communicated to host 102 as illustrated in FIG. 2. The readback or decoder mode also employs an error correction unit (ECU) 120 which receives syndromes 121 generated by syndrome/parity generator 110 generates an uncorrectable error signal or indication 121 if the actual PBA (or LBA) is not equal to the expected PBA (or LBA) determines whether an error has occurred, but does not require the multiplexer 108 as the host has no need for parity and only receives the data D(x).

Unfortunately, if the seed values (in this case the PBA or LBA) used by randomizer 116 for write and readback operations of the same data are different, then the write output randomizer sequence and read output randomizer sequences will also be different and will not match or cancel each other as expected. Seeding values will be different, for example, if the estimated PBA (or LBA) is different from the actual PBA. When an error is detected, ECU 120 merely identifies that an uncorrectable error has occurred independent of whether the origin of the error is corrupted data, such as might be caused by media failure, or as a result of the actual PBA not matching the estimated PBA. In traditional systems no procedure is available for otherwise identifying the cause of the error as a wrong PBA.

This traditional approach therefore fails to solve all of the problems associated with error correction and wrong PBA and in particular does not allow one to distinguish between an uncorrectable data error and a wrong PBA. The traditional approach is also incapable of recover the actual PBA from the readback data.

It is desirable to distinguish between an uncorrectable data error and a wrong PBA (or LBA) for several reasons. First, a wrong PBA or LBA is of fundamentally different nature than a error caused, for example, by faulty media or the like. Second, it is useful to be able to recover the actual PBA or LBA from the readback data for adjusting the seek or synchronization operation of the disk drive during design of the control procedure. Finally, it may be advantageous in some high density recording systems where there may be a somewhat higher possibility that the portion of the disk read (PBA) is not the portion of the disk that should have been read, and to recover the actual PBA from the readback data to permit real-time or near-real-time adjustment of the seek operation control system. Therefore, a need exists for a solution to the problem of being able to distinguish between an uncorrectable data error and an wrong PBA or LBA, and a solution to the problem of being unable to recover the actual PBA or LBA from readback data.

The present invention provides a solution to this and other problems, and offers other advantages over the prior art.

SUMMARY OF THE INVENTION

The present invention relates to systems, devices, and methods that have a polynomial multiplier circuit operating on a prepended sequence derived from the storage device physical or logical block address and which provide an improved codeword stored on the media and which can distinguish an uncorrectable data error from a wrong block address error and permit the actual block address to be recovered from data read from the storage media in a data storage system to solve the above-mentioned problem.

In accordance with one embodiment of the invention, method for generating a parity symbol sequence of a code is provided in which a sequence representing an m-symbol address is received and a sequence of k data symbols is received. The sequence representing an m symbol address is multiplied by a set of multiplier symbols to generate a first sequence of product symbols that is equal to the sum of a first sequence and a second sequence wherein the last r coefficients (r is equal to the number of parity symbols) of the first sequence are zero and the degree of the second sequence is one less than the number of parity symbols. Then first sequence of product symbols is added to the data sequence prior to generating a first parity sequence for the sum of the data sequence plus the first sequence during a data transmission phase for the first k symbols of the codeword. Subsequently, the second sequence is added directly to the first parity sequence during a parity transmission phase for a number of symbols at the end of the codeword to generate the final parity sequence.

In accordance with another embodiment of the invention, the method for generating a parity symbol sequence of a code further includes generating a syndrome symbol sequence. Generating the syndrome symbol sequence involves receiving a sequence representing an m-symbol address estimation which may not be equal to the sequence representing the m-symbol address and a readback sequence of k+r data and parity symbols, some of which may be in error. Then the sequence representing the m-symbol address estimation is multiplied by a set of multiplier symbols to generate a second sequence of product symbols which will be identical to the first sequence of product symbols if m-symbol address estimation sequence is equal to the m-symbol address sequence. The second sequence of product symbols is also added to the readback sequence to generate a sum sequence, and syndromes are generated for the sum sequence.

Apparatus and system implementing the inventive method are also provided. For example, a data storage system for a computer system having the inventive features, such as may be provided for a rotating magnetic disc storage system, a magneto-optical storage system, a tape storage system, or any other data or information system when the address or location of the data may be in question. The inventive apparatus, system, and method may also be more generally applied to associate some form of auxiliary information (non-user data) other than address block information with user data so that errors in such auxiliary information may be identified and the auxiliary information recovered. The present invention also can be implemented as a computer-readable program storage device which tangibly embodies a program of instructions executable by a computer system to perform a block address error discrimination and recovery method. In addition, the invention also can be implemented as a block address error discrimination and recovery circuit itself, which circuit may be implemented as an element of a data storage system such as a disc drive system, which itself may for a constituent element of a computer system. Among its advantageous features, the invention provides physical block address and/or logical block address (PBA/LBA) recovery with virtual prepending in a headerless PBA/LBA integrity scheme.

These and various other features as well as advantages which characterize the present invention will be apparent upon reading of the following detailed description and review of the associated drawings.

BRIEF DESCRIPTION OF THE DRAWINGS

FIG. 1 is a block diagram of a conventional data storage system having a randomizer based error correction code encoder/decoder unit in a write operation mode.

FIG. 2 is a block diagram of a conventional data storage system having a randomizer based error correction code encoder/decoder unit in a read operation mode.

FIG. 5 is a diagrammatic illustration showing a comparison of sequential prepending and the manner in which a function S(x) having the length of a data sequence and parity of prepended physical block address may be added to data and processed to get the same parity as obtained with sequential prepending.

DETAILED DESCRIPTION

Figure 3:
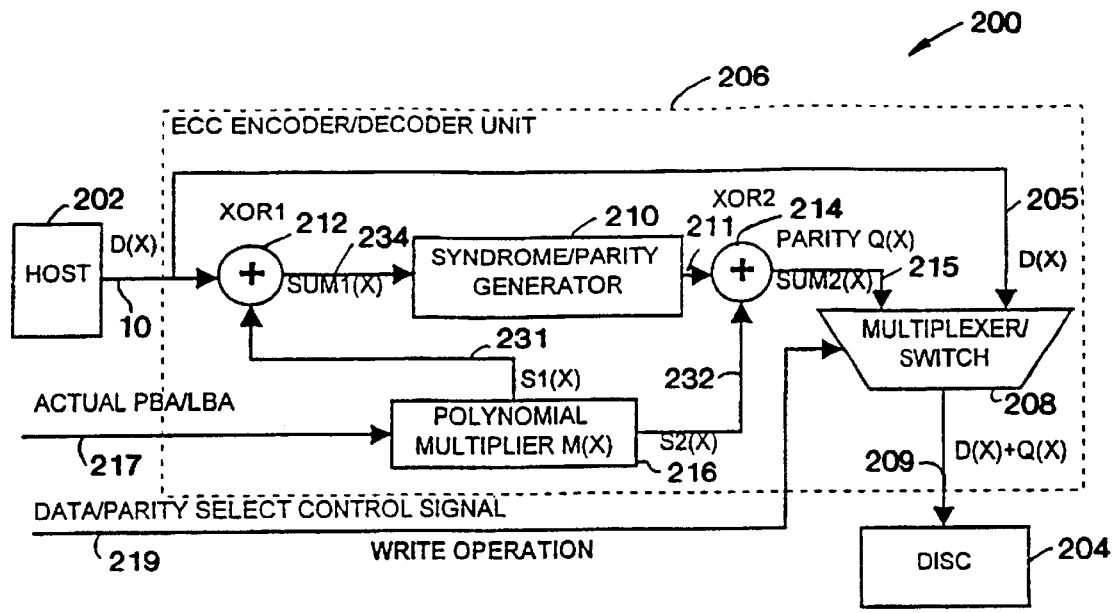
FIG. 3 is a block diagram of an embodiment of the inventive data storage system having a polynomial multiplier based error correction code encoder/decoder unit in a write operation mode.

Embodiments of the inventive structure and method are now described relative to the figures. Referring now to FIG. 3, an embodiment of a computer system 200 incorporating the inventive ECC encoder/decoder 206 in the context of a disc 204 based data storage system is shown. A system, like the one shown in FIG. 3 includes a host computer 202 of conventional type having a memory, a display, a pointing device, and a data storage system such as a hard disc drive 204 magneto-optical drive or the like, in addition to an error correcting code (ECC) encoder/decoder 206. The inventive method may be practiced by implementing in executable software, firmware, hardware, or a combination thereof in the computer system 200; although, the invention is advantageously implemented at least in part in hardware associated with a controller (not shown) associated with disk drive 204 so that the speed of execution is appropriate to the speed at which data is written to or readback from the disc.

FIG. 3 illustrates a first embodiment of the computer data storage system 200 of the present invention. A host computer system 202 writes data D(x) 205 to the data storage medium such as disc 204 and reads data D(x) 205 from data storage medium 204. A first FIFO (first-in-first-out buffer) or buffer (not shown) may typically be used to temporarily store the data 205 that is transferred between the host computer or processor 202 and the data storage medium 204. When the host 202 writes data to the data storage medium 204, the user data stored in the FIFO is transmitted to the error correction code (ECC) encoder/decoder unit 206 that encodes the sum 234 of the user data bytes D(x) 205 and the sequence $S_1(x)$ 231 generated based on the actual BPA/LBA sequence; generates an output including first partial parity bytes or symbols 211. The manner in which the output 211 from the syndrome/parity generator 210 is subjected to further processing by adding the output $S_2(x)$ 232 of polynomial multiplier 216 to generate the final parity Q(x) 215 is described in greater detail below. The output 209 of the encoder including data 205 and parity 215 is written to the data storage medium 204 by a disc interface (not shown) of conventional type.

Data D(x) with appended parity Q(x) 225 that is read from a data storage medium 204 during a read operation (See FIG. 4) is read by the disc interface and transferred to a buffer (not shown) typically through a FIFO. (The various FIFO's and buffers are not shown in the figures in an attempt to preserve clarity in the description of the invention, as they are of conventional type and there design and use in such data storage systems is well known in the art.) In addition, the read sequence 225 is transmitted to the ECC encoder/decoder unit 206 together with the estimated PBA/LBA sequence 213. The ECC encoder/decoder unit 206 computes syndromes 226 and determines whether the received data and/or estimated PBA/LBA sequence contains any bytes or symbols in error. Erroneous symbols are detected by the error correction unit 220 within or associated with ECC encoder/decoder unit 206 and result in generating a error indicator such as PBA error flag 227 and an error value such as PBA error value 229 in the case of a mismatch between the estimated PBA/LBA 213 and the actual PBA/LBA 217. Where the syndromes do not suggest any error, the information processed by ECC encoder/decoder 206 is decoded and communicated to host 202.

Figure 4:
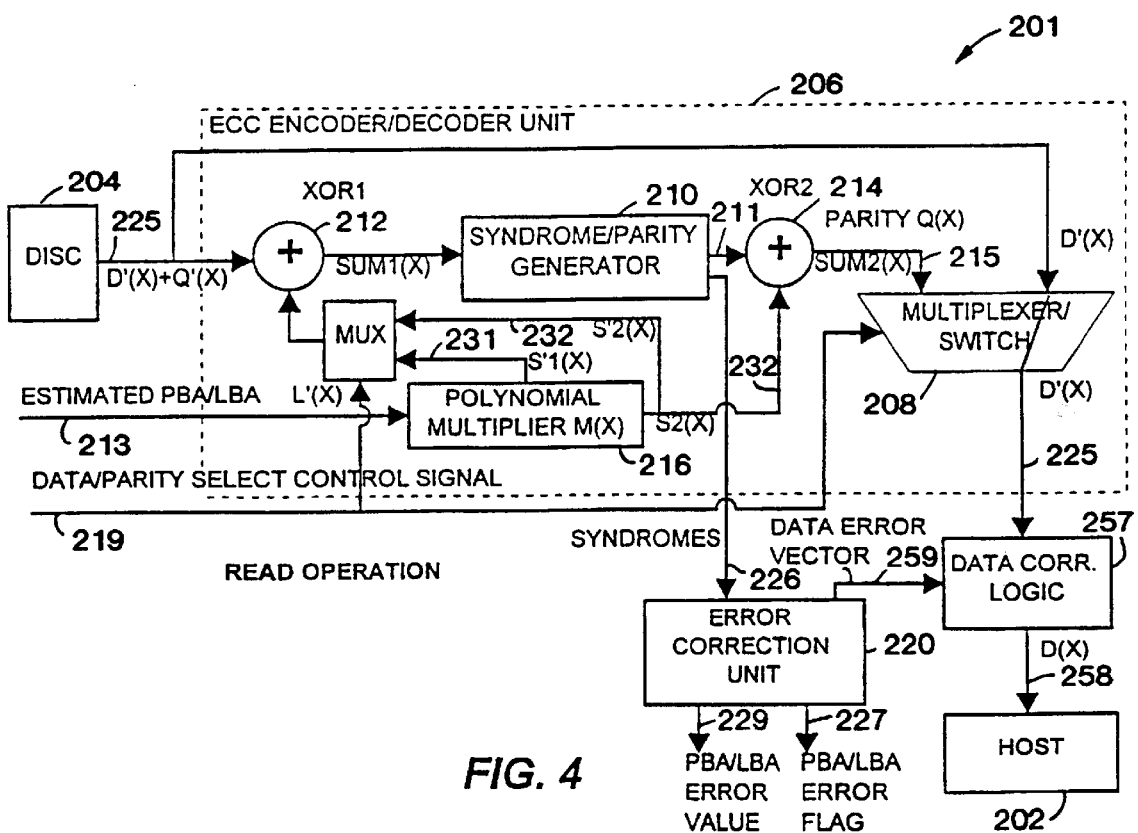
FIG. 4 is a block diagram of an embodiment of the inventive data storage system having a polynomial multiplier based error correction code encoder/decoder unit in a read operation mode.

The present invention can be summarized in reference to FIG. 3 and FIG. 4 which are block diagrams of a preferred embodiment of the inventive ECC encoder/decoder unit 206 in write (encode) and read (decode) operating modes respectively, having a polynomial multiplier unit generating the polynomial sequence $S(x)=L(x) \times M(x) \times_x x^{k-m-u+1}$, where L(x) is the PBA (or LBA) or some representation derived from the PBA (or LBA), and M(x) is a polynomial of the form $x^{m+r-1+u}$ mod g(x), where x is the variable of the polynomial, m is the number of prepended bytes (symbols) per codeword interleave, r is the number of parity bytes, $0 \leq u < (k-m+1)$ is a delay value, and g(x) is the generator polynomial. Recall, that as used in this description, a byte is a symbol having an arbitrary number of bits.

ECC encoder/decoder 206 generates a parity byte sequence Q(x) which is different from the parity byte sequence P(x) generated in traditional ECC encoder/decoder units, such as the ECC encoder/decoder unit described relative to FIG. 1 and FIG. 2, but still fitting within the same number of bytes written on the storage media (disc) as the traditional parity P(x) while advantageously providing discrimination between an uncorrectable error and a wrong PBA (or LBA), and providing sufficient information to recover the PBA or LBA from the readback data.

In order to generate the codeword having virtually prepended bytes, which is written to the disc, a polynomial multiplier block 216 for multiplying the sequence $L(x) \times x^{k+r-m-u}$ by $x^{m+r-1+u}$ mod g(x), when a delay u is desired, to form $S_1(x)$ and $S_2(x)$ is added to the ECC encoder/decoder which typically includes the parity/syndrome generator unit. First and second exclusive-OR circuits (XOR1, XOR2) 212, 214 to perform the required addition are also provided within the ECC encoder/decoder. In the embodiment illustrated in FIG. 3 and FIG. 4, the multiplier 216 requires r−1 additional zeroes to be shifted-in to generate the last r−1 bytes of $S_2(x)$. Typically the parity/syndrome generator 210 includes registers for storing computed values until they are to be output, but these registers have not been shown as they are of conventional type. This flushing of the multiplier with additional zeros is equivalent to feeding $L(x)x^{k+r-m}$ instead of $L(x)x^{k-m+1}$ as the input sequence.

In the beginning of the encoding process during a write operation, the output multiplexer 208 transfers user data D(x) to the output. The user data D(x) is fed to the data input of the parity generator 210 simultaneously with the bytes of the prepended sequence L(x). Multiplying D(x) by $x^r$ and L(x) by $x^{k+r-m}$ corresponds to appending r and k+r−m zeroes to D(x) and L(x) respectively. S(x) is generated at the output of multiplier block 216 during the first k symbols and added both to D(x) at the input of the parity/syndrome generator 210. After processing k bytes, multiplexer 208 is switched to "parity" input using the data/parity select control signal, and the parity bytes are transferred. The multiplier 216 starts generating the bytes of $S_2(x)$, which may be all zero. $S_2(x)$ is added to the output of the parity/syndrome generator 210 to form the required sequence.

During readback operation, the procedure is the same as the write operation encoding process, except that during readback there is no distinction made between data and parity bytes and both S1(x) and S2(x) are added to the read sequence at the input of the parity/syndrome generator 210, so that the XOR element 214 is not needed at all.

We now briefly discuss Reed-Solomon codes to serve as a basis to understand the theoretical basis for virtual prepending of the PBA (or LBA) according to the invention. It should be understood that even though this disclosure provides detailed descriptions of embodiments of the invention in terms of Reed-Solomon codes, the inventive structure and method are applicable to cyclic codes generally, and to BCH and Reed-Solomon codes more particularly. A Reed-Solomon (RS) codeword can have only a limited number of data bytes. For example, in an exemplary data field with the designed symbol error correcting capacity of the code of five symbols (t=5), four interleaves (I=4), and five bytes of error detection code parity (EDC=5), the maximum number of user data bytes is $k_{max}=975$, leaving 45 bytes for parity in the 1020 byte field. If the number of user data bytes k is less than $k_{max}$, then the first $k_{max}-k$ bytes can be used for transfer of additional information.

The inventive structure and method utilizes these free bytes in the cyclic codeword (nominally at the beginning of the codeword), such as an RS codeword, to transfer PBA or LBA information to the sequence of bytes which is stored on the disc. The term "prepended" and variations (such as "prepend" or "prepending") are used to describe the fact that the additional bytes are placed at the beginning of the codeword. In one embodiment, the PBA or LBA is prepended at a rate of one byte per interleaf, however, a greater number of PBA or LBA bytes may be prepended per interleaf.

As will become more clear later in the description, the PBA or LBA bytes themselves are not written to the disc drive or other storage means during a write operation; however, parity during the write operation and syndromes during the read operation are calculated as if the PBA or LBA were present. For this reason, the prepended PBA or LBA bytes may be considered "virtual" rather than "real" in the sense that they are never actually written to the disc drive or other storage device. In spite of the fact that the prepended bytes themselves are not written to the storage device, during a readback operation, if PBA (or LBA) bytes represented by the computed syndromes differ from the PBA (or LBA) parity computed during the write operation, the ECC will correct errors in PBA (or LBA) positions, and therefore the inventive structure and method provide recovery from PBA (or LBA) errors.

A codeword in a Reed-Solomon (RS) code over Galois Field of the order of 256 {GF(256)} has a limited length $n=k+r \leq 255$, where k is the number of user data bytes and r is the number of parity bytes. The value of the number of parity bytes r is determined by the detecting/correcting capability of the code, so for a code with a given correction capability the number of user data bytes k is always less than or equal to the maximum number of user data bytes $k_{max}=255-r$. If the actual number k of user data bytes is less than $k_{max}$, the first $k_{max}-k$ positions are "free" or available and may be used for transfer of $m \leq k_{max}-k$ bytes of additional information.

For example, having four bytes of logical block address (LBA) or physical block address (PBA) and four interleaves of error correcting code (ECC) we can prepend the LBA (or PBA), one byte per interleaf (m=1). In the case of three interleaves, using one byte per interleaf, the invention only uses the three low order bytes of PBA (or LBA).

The ECC logic will calculate errors in these additional PBA or LBA bytes in exactly the same way as it does for the user data. These additional PBA or LBA bytes are not actually written to the disc or other storage means, but are taken into account by the ECC encoder during the parity calculation in a write operation.

During a readback operation the estimated values of these PBA or LBA bytes are used for syndrome calculation in syndrome/parity generator unit 210 as if they were read from the disc. A mismatch between estimated or expected PBA (or LBA) 213 and actual PBA (or LBA) 217 values will be detected by the error correction unit 220 in response to received syndromes during readback operation in ECC logic within the error correction unit 220 (See FIG. 4) by generating a PBA error flag and a PBA error value. The PBA (or LBA) error condition and PBA (or LBA) error value can be used to restore actual PBA (or LBA) value.

We now describe several ways in which the computation of contribution of the PBA or LBA bytes to the parity/syndrome computation may be accomplished. It is noted that in some implementations, the error detection code (EDC) will have only one interleaf and needs to cover all prepended PBA or LBA bytes, for example an implementation with four (m=4) or three (m=3) ECC interleaves, respectively. In some instances, this may make the computation of the contribution of the PBA/LBA bytes to the EDC parity/syndrome computation more difficult compared to the computation of the contribution to the ECC.

In one embodiment of the inventive structure and method, the same structure is used for parity generation during the write operation and for syndrome generation during a readback operation; therefore, this description frequently refers to a common parity/syndrome generator. However, it should be understood that the inventive structure and method are not limited to implementations in which the parity generator and syndrome generator are the same physical structure of have the same design if separate physical structures. Therefore, parity/syndrome generator 210 as used in this description should be interpreted as a shared parity and syndrome generator unit, or a parity generator unit, or as a syndrome generator unit. The parity/syndrome generator may be any conventional form consistent with the requirements of the invention set forth here, of which many structures are known, and is not described here further.

One way to perform the parity/syndrome calculation incorporating PBA or LBA information is to prepend a sequence L(x) representing the PBA or LBA bytes to the user data D(x) and run the parity/syndrome generator 210 for m+k+r clock cycles, as if there were m+k user data bytes to generate parity Q(x). This approach is useful and may provide the most compact approach in terms of the hardware needed, but undesirably requires m additional clock cycles of processing time for the m additional bytes per interleaf. In some storage device implementations, such as for example, in high-performance disc drive storage systems, these additional clock cycles may not be available. This approach may be referred to as "sequential prepending". The sequential prepending approach is illustrated diagrammatically in FIG. 5, with several other approaches described hereinafter.

A second approach for performing the parity/syndrome calculation is to pre-compute the contribution of the additional PBA/LBA bytes to the parity/syndromes and pre-load the parity/syndrome generator 210 with these values before processing the first user data byte. One possible disadvantage of this approach is the possible need for two different pre-computation circuits for parity and syndromes, depending on the parity generator structure, the syndrome generator structure, and the value of m. However, this potential disadvantage does not arise for the case when m=1, that is, when there is only one prepended byte per interleaf. In this case, if the combined parity/syndrome generator is used, both of the pre-computation circuits are simply wires or other direct coupling or connection. In one embodiment of the invention, this exception is advantageously used for the ECC parity/syndrome calculation.

We now describe an embodiment of the inventive method to generate parity/syndrome within k+r clock cycles using the same pre-computation circuitry for generating both parity and syndromes. The result of each pre-computation is an "equivalent" sequence of bytes of total length n=k+r, the same length as the traditional length of the codeword based on user data only. This sequence is equivalent to the prepended sequence L(x) in terms of parity and syndrome computation.

Only the first m+r−1 bytes of the equivalent sequence can have nonzero values, all other bytes being zero. We know this because the sequence is the product of two polynomials of known degree. In at least one embodiment of the invention, the prepended sequence L(x) is provided in parallel with the arriving user data D(x), and is multiplied by the polynomial $M(x)=[x^{k+r-m} \mod g(x)]$ by multiplier circuit 216 to generate equivalent sequence $S(x)=L(x) \, x^{k+r-m} \mod g(x) \times x^{k-m+1}$. An exemplary multiplier 216 structure is described below which can accomplish the required polynomial multiplication. More generally the multiplier polynomial may be of the form $M(x)=[x^{k+r-m+u} \mod g(x)]$, where u represents a delay from the start of user data and is nominally in the range $0 \leq u < (k-m+1)$. This form of M(x) permits delaying the start of PBA/LBA contribution to the parity relative to the start of computation based on user data D(x), such that for example, the computation of the PBA/LBA contribution may be delayed an arbitrary amount within the range $0 \leq u < (k-m+1)$ bytes, where u=0 represents no delay, and u=(k−m+1) represents a delay wherein the PBA/LBA and D(x) contribution to parity complete at the same time.

In the case when m+r−1>k>m−2, the last (m+r−1)−k bytes of the equivalent sequence S(x) are XOR'ed directly to the output of the parity/syndrome generator 210 to obtain parity bytes that are fed to output multiplexer 208. For k outside this range, S(x) is XOR'ed by exclusive or circuit 212 with the data D(x) starting with the first data byte; then the result is fed into the parity/syndrome generator 210.

This particular embodiment of the inventive structure and method may not generally work when k<m−1 because the length of a codeword may generally be smaller than the number of nonzero bytes in the equivalent sequence; however, this limitation does not apply in an EDC implementation in which EDC with m=4 if the number k of user data bytes is guaranteed to be not less than 5. Though not limitation of the inventive structure or method, in the exemplary embodiments described hereinafter, it is assumed that $k \geq m+r-1$ unless otherwise specified.

Figure 6:
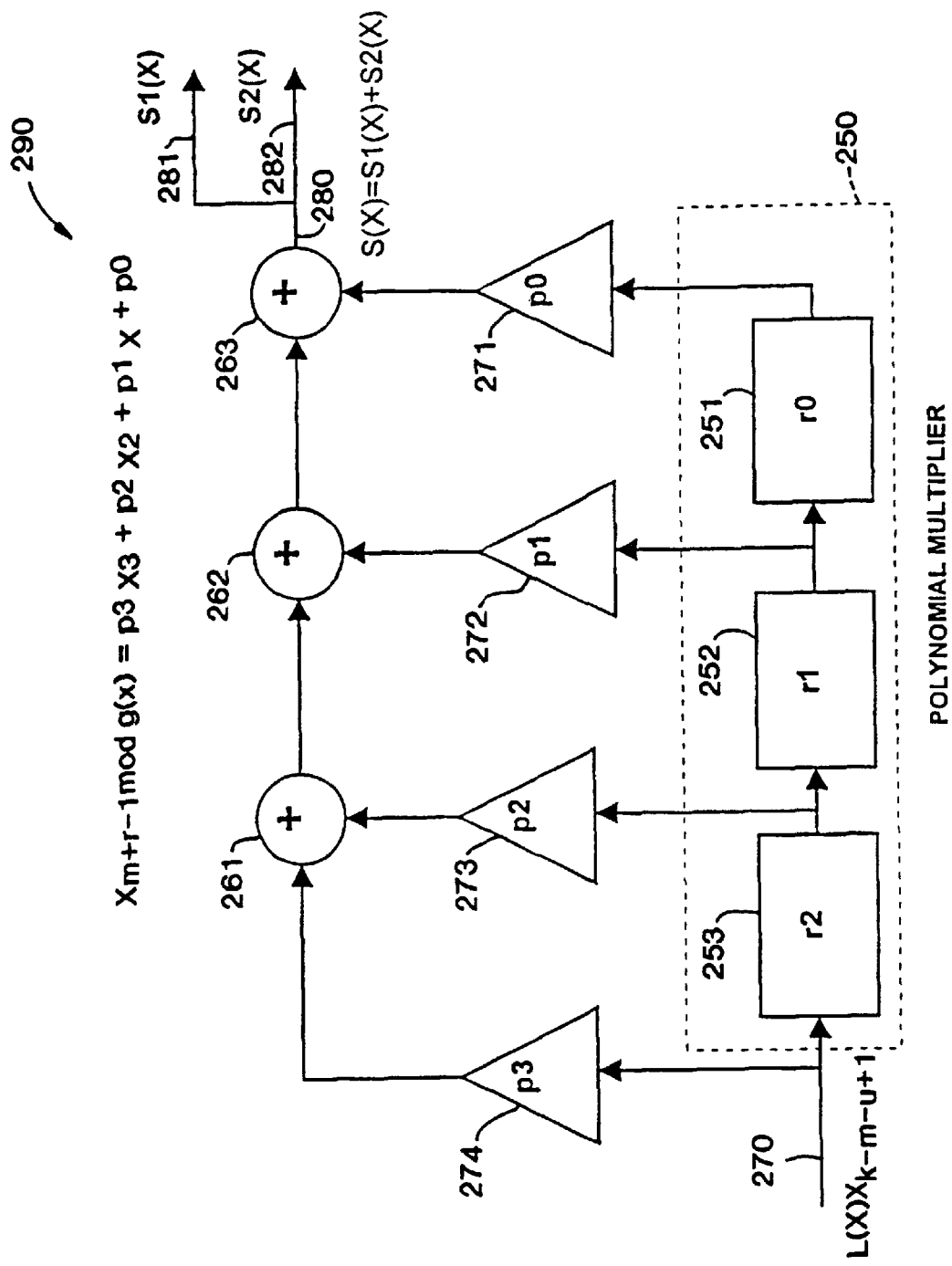
FIG. 6 is a diagrammatic illustration showing an embodiment of the inventive multiplier circuit.

We now describe one embodiment of the multiplier 216 for use in the ECC encoder/decoder unit 206 relative to the illustration in FIG. 6 to illustrate the manner and an exemplary structure by which the multiplication may be performed. The exemplary multiplier circuit is for the case of r=4, but it will be clear to those workers having ordinary skill in the art will appreciate that this exemplary circuit may readily be expanded or contacted to accommodate larger and small values of r, and that alternative circuits may be implemented to perform aspects of the inventive method. Multiplier circuit 216 comprises a shift register (r2, r1, r0) 250 having three register elements 251, 252, 253, three XOR elements 261, 262, 263 and four constant multipliers 271, 272, 273, 274 for multiplying the delayed versions of the sequence $L(x)x^{k+r-m}$ by the coefficients $p_3$, $p_2$, $p_1$, and $p_0$ of the expression: $x^{m+4-1} \mod g(x) = x^{m+3} \mod g(x) = p_3 x^3 + p_2 x^2 + p_1 x + p_0$.

Before the first byte of the input sequence comes in, register 250 is set to 0, that is each stage r2, r1, r0 are set to zero ("0"). During operation the bytes of the input sequence are shifted into the register 250 one at a time, generating the corresponding elements of S(x) 280 at the output of XOR gate 263 according to the above expressions. Note that S(x) 280 is the sum of $S_1(x)$ 281 and $S_2(x)$ 282 in the manner described. The last r symbols of S(x) are referred to as $S_2(x)$ 282, the rest of the symbols of S(x) represent $S_1(x) \times x^{-r}$.

We now describe some theoretical and mathematical considerations relating to polynomial representations of a codeword as they relate to the instant invention. In our further description we represent sequences of bytes by corresponding polynomials with coefficients over an exemplary Galois Field of the order of 256 {represented by the notation GF(256)}. The polynomial corresponding to a sequence of values $d_{k-1}, d_{k-2}, \ldots, d_1, d_0$ is the polynomial $d_{k-1}x^{k-1} + d_{k-2}x^{k-2} + \ldots + d_1 x + d_0$. The original n=k+r byte codeword $C(x)=D(x)x^r+P(x)$ and its constituent parts (k byte data D(x) and r byte parity P(x)) have the structural and polynomial representations shown in the following equations and Tables I–IV, where k bytes are used to represent the user data and the degree of D(x)=k−1.

TABLE I

User Data.

(1)

User data, k bytes

| $d_{k-1}$ | $d_{k-2}$ | ... | $d_1$ | $d_0$ |

$D(x) = d_{k-1}x^{k-1} + d_{k-2}x^{k-2} + \ldots + d_1 x + d_0$, deg D(x) = k - 1;

TABLE II

Parity.

(2)

Parity, r bytes

| $p_{r-1}$ | $p_{r-2}$ | ... | $p_1$ | $p_0$ |

$P(x) = p_{r-1}x^{r-1} + p_{r-2}x^{r-2} + \ldots + p_1 x + p_0$, deg P(x) = r - 1;

TABLE III

Codeword C. (3)

| Codeword C, n = k + r bytes | | | | | | | | | |
|---|---|---|---|---|---|---|---|---|---|
| User data, k bytes | | | | | Parity, r bytes | | | | |
| $d_{k-1}$ | $d_{k-2}$ | ... | $d_1$ | $d_0$ | $p_{r-1}$ | $p_{r-2}$ | ... | $p_1$ | $p_0$ |
| $C(x) = D(x)x^r + P(x)$ | | | | | deg $C(x) = k - 1 + r$. | | | | |

The prepended sequence of m bytes $l_{m-1}, l_{m-2}, \ldots, l_1, l_0$ is represented by the polynomial L(x) as follows:

$$L(x)=l_{m-1}x^{m-1}+l_{m-2}x^{m-2}+\ldots+l_1x+l_0, \deg L(x)=m-1 \quad (4)$$

Codeword B consists of the prepended sequence, user data and corresponding parity bytes, as shown in the following equation and Table IV.

TABLE IV

Codeword B (5)

| Codeword B, m + k + r bytes | | | | | | | | | | | | | |
|---|---|---|---|---|---|---|---|---|---|---|---|---|---|
| Pending, m bytes | | | | User data, k bytes | | | | | Parity, r bytes | | | | |
| $l_{m-1}$ | $l_{m-2}$ | ... | $L_0$ | $d_{k-1}$ | $d_{k-2}$ | ... | $d_1$ | $d_0$ | $q_{r-1}$ | $q_{r-2}$ | ... | $q_1$ | $q_0$ |
| $B(x) = L(x)x^n + D(x)x^r + Q(x)$; deg $B(x) = m + k + r - 1$. | | | | | | | | | | | | | |

We do not write the codeword B(x) which includes the prepended sequence L(x) to the disc, so the sequence A(x) which is actually written to the disc is not a codeword and does not actually include the prepended bytes L(x), but rather the sequence of bytes A(x) is written as follows:

$$A(x)=D(x)x^r+Q(x) \quad (6)$$

While reading back the sequence A(x), which in some instances may have been corrupted by errors, restoration of the codeword B(x) is attempted by prepending the estimated or expected prepending sequence L(x) to A(x) and applying conventional error correction.

We now turn our attention to parity generation during write (encode) operation, and will later show that parity generation discussion is directly applicable to syndrome generation as well.

Since a Reed-Solomon (RS) code is a cyclic code, codewords should satisfy the condition C(x)mod g(x)=0, where C(x) is a codeword, and g(x) is the generator polynomial, and the degree of g(x) is r-1 (deg g(x)=r-1). Therefore, if it is desired that the code be systematic, that is that:

$$C(x)=D(x)x^r+P(x), \quad (7)$$

it must be true that:

$$P(x)=[D(x)x^r]\mod g(x), \quad (8)$$

that is, the parity byte sequence P(x) is represented by a polynomial equal to the remainder after dividing $D(x)x^r$ by the generator polynomial g(x).

In analogous manner, in the context of sequential prepending for the codeword B(x) with prepended sequence L(x), we have the relationship:

$$B(x)=[L(x)x^k+D(x)]x^r+Q(x) \quad (9)$$

and $$Q(x) = \{[L(x)x^k + D(x)]x^r\}\mod g(x) \quad (10)$$

$$= [L(x)x^{k+r}]\mod g(x) + [D(x)x^r]\mod g(x)$$

or $$Q(x)=[L(x)x^{k+r}]\mod g(x)+P(x). \quad (11)$$

In general, for sequential prepending, since a parity/syndrome generator processes an input sequence B(x) one byte at a time, it will take (m+r+k) clock cycles to generate Q(x), that is it will take k+r cycles to generate P(x), but m+k+r cycles to generate $[L(x)x^{k+r}]$mod g(x).

Two conditions should be met relative to equivalent sequence S(x) and D(x) so that the parity/syndrome generator 210 can receive the two input sequences and process them in a pair wise manner. A polynomial S(x) satisfying the conditions:

1. deg $S(x)=\deg D(x)x^r=r+k-1$; and (12)

2. $S(x)$mod $g(x)=[L(x)k^{k+r}]$mod $g(x)$; (13)

will enable generation of parity Q(x) within the required k+r cycles by simply adding an S(x) having the required properties to $D(x)x^r$ and processing the resulting sum sequence as normal user data. Recall that $D(x)x^r$ corresponds to appending r zeros to D(x), just as $L(x)x^{k+r-m}$ corresponds to appending K+r-m zeros to L(x). In the inventive structure and procedure this resulting sum sequence is generated using the exclusive or (XOR) circuit.

Out of an abundance of caution and for the sake of a complete disclosure, we now provide a derivation for exemplary functions S(x) and R(x) using mathematical properties of modulo arithmetic for some generalized functions M(x) and N(x). However, it should be understood that the inventive structure and method are not to be limited by this derivation, and the other forms of S(x) and R(x) are within the scope and spirit of the invention. More particularly, we derive relationships for S(x) as a function of the product of L(x) R(x). First, recall that under the properties of arithmetic modulo g(x).

$$[M(x) \times N(x)]\mod g(x) = [M(x)\mod g(x) \times N(x)]\mod g(x) \quad (14)$$

$$= [M(x) \times N(x)\mod g(x)]\mod g(x)$$

$$= [M(x)\mod g(x) \times N(x)\mod g(x)]\mod g(x).$$

Then, applying condition (2) in equation (13) requiring that $S(x)$mod $g(x)=[L(x)k^{k+r}]$mod $g(x)$, we have a relationship as follows:

$$[L(x)x^{k+r}]\mod g(x) = [L(x)x^{k+r-s} \times x^s]\mod g(x) \quad (15)$$

$$= \{L(x) \times [x^{k+r-s} \times x^s\mod g(x)]\}\mod g(x)$$

$$= [L(x) \times R(x)]\mod g(x)$$

and $$R(x)=x^{k+r-s} \times x^s \mod g(x), \text{ where } \deg R(x)=k+r-s+r-1. \quad (16)$$

Now we identify a suitable value of "s" by applying condition (1) requiring "deg S(x)=deg $D(x)x^r=r+k-1$" to arrive at the result that:

$$\deg S(x)=\deg[L(x) \times R(x)]=m-1+k+r-s+r-1=r+k-1 \quad (17)$$

and $$s = m+r-1. \quad (18)$$

Then, substituting this value for s into the expression for R(x) above, and recalling that S(x) was assumed to be of the form L(x) R(x) we arrive at useful definitions of R(x) and S(x) as follows:

$$R(x) = x^{m+r-1} \bmod g(x) \times x^{k-m+1} \quad (19)$$

and $$S(x) = [L(x) \times x^{m+r-1} \bmod g(x)] \times x^{k-m+1}. \quad (20)$$

Conventional parity/syndrome generators are designed to process only a sequence of user data and assume that the last "r" bytes of the input sequence $D(x) \times x^r$ are zeros and take only the first D(x) as the input sequence, ignoring any remaining values. In the inventive structure and method, only the last k−m1 bytes of S(x) are guaranteed to be zero and in the case when r>k−m+1, some of the nonzero bytes in S(x) cannot be fed into a conventional parity/syndrome generator. Since it is desirable that the parity/syndrome generator 210 be a conventional parity/syndrome generator or at least that embodiments of the inventive structure and method be compatible with such conventional parity/syndrome generators, one embodiment of the invention treats the polynomial S(x) as the sum of two polynomials and provides additional structure and procedure to handle the additional values.

Using this approach, we write S(x) as the sum of two polynomials $S_1(x)$ and $S_2(x)$ as follows:

$$S(x) = S_1(x) + S_2(x), \quad (21)$$

where $\deg S_2(x) = r-1$, and require the last r coefficients of $S_1(x)$ to be zero; and $$S(x) \bmod g(x) = S_1(x) \bmod g(x) + S_2(x) \bmod g(x). \quad (22)$$

$S_1(x)$ is fed into parity generator 210, even a parity generator designed only for user data, yielding the result $[S_1(x) \bmod g(x)]$ at its output. Since the degree of polynomial $S_2(x)$ is less than the degree (r) of generator polynomial g(x) which itself is equal to r, ($\deg S_2(x) < \deg g(x) = r$), it follows that $S_2(x) \bmod g(x) = S_2(x)$ and one can add $S_2(x)$ to the output of the parity generator at the appropriate time to form the sequence $S(x) = S_1(x) + S_2(x)$ in proper time order.

It should be understood that in the case when k<m−1 this procedure may not generally used without modification since under this condition:

$$\deg L(x) + \deg R(x) + 1 = m+r-1 > k+r \quad (23)$$

so that the length of the nonzero part of the required S(x) exceeds the length of the entire sequence to be written to the disc.

Syndrome generation is a process analogous to parity generation which occurs during readback or retrival of previosuly stored information from the storage device. Let C(x) be the codeword polynomial corresponding to the sequence of bytes read from a disc or other storage media, and $$g(x) = (x+a_{r-1})(x+a_{r-2}) \ldots (x+a_1)(x+a_0) \quad (24)$$

be the generator polynomial of the code. The syndrome components $S_{r-1}, \ldots, S_0$ are defined as the values of C(x) at $x = a_{r-1}, \ldots, a_0$: $S_{r-1} = C(a_{r-1}), \ldots, S_0 = C(a_0)$. It can be shown that if "a" is a root of generator polynomial g(x), then $$C(a) = [C(x) \bmod g(x)]|_{x=a}, \quad (25)$$

where the expression [C(x) mod g(x)] is the remainder after division by generator polynomial g(x), and the notation "$|_{x=a}$" means the polynomial is evaluated at a particular value x=a.

Recall from the description provided earlier that adding S(x) to the data polynomial $D(x) \times x^r$ is equivalent to prepending L(x) in terms of generated parity bytes, where here the generated parity bytes are the remainder after division by the generator polynomial g(x). Thus one can use exactly the same procedure for generating syndromes during the readback operation as the procedure for generating parity bytes during the write operation, except that for the write operation the data comes from the host and during the readback operation the data comes from the storage device.

Figure 7:
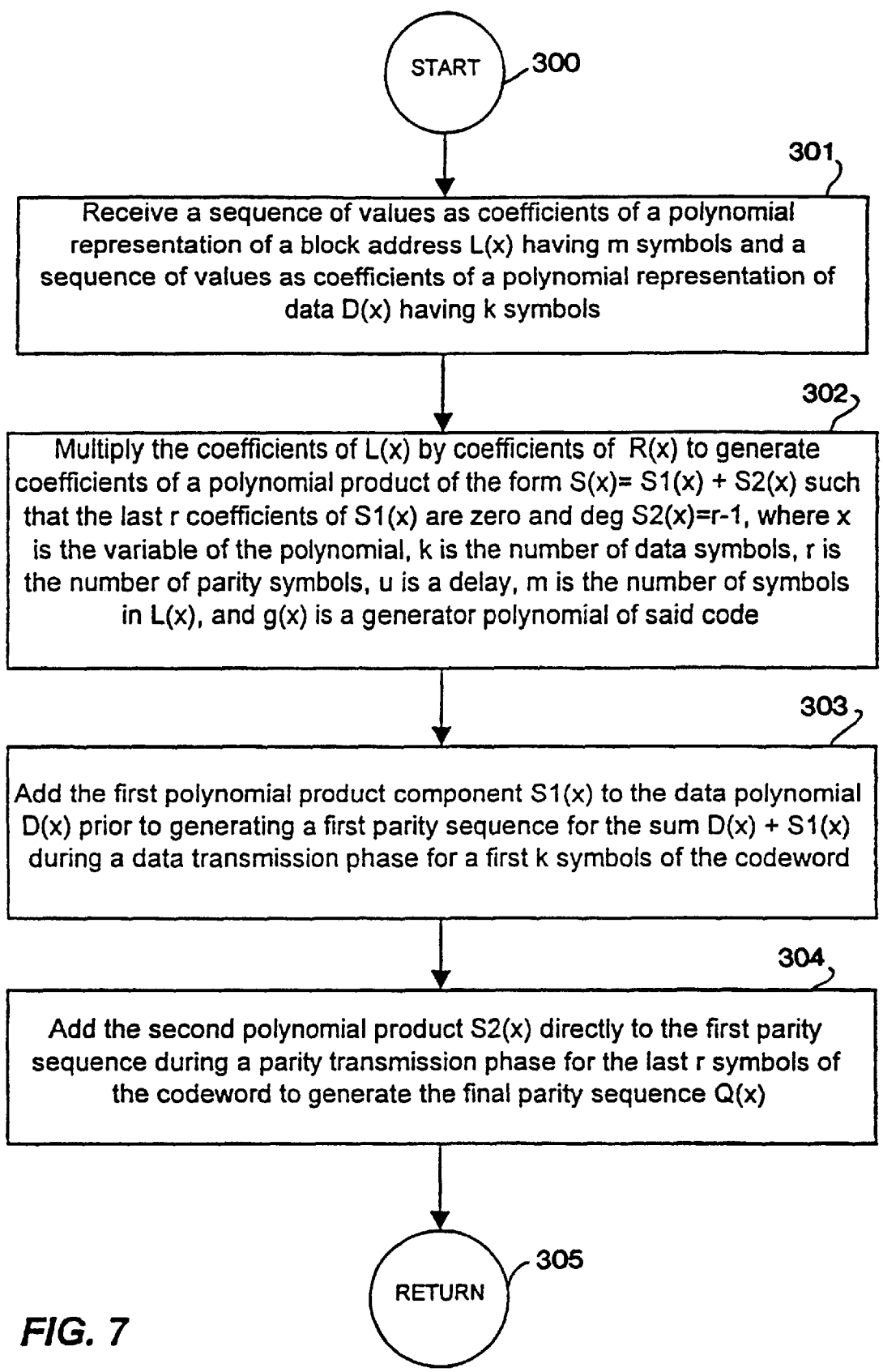
FIG. 7 is a flowchart detailing an embodiment of the inventive method.

Finally, having described embodiments of the inventive structure and method, we now describe an embodiment of the inventive procedure 300 relative to a flow-chart in FIG. 7. First, receive a sequence of values as coefficients of a polynomial representation of a block address L(x) having m symbols and a sequence of values as coefficients of a polynomial representation of data D(x) having k symbols (Step 301). We next multiply the coefficients of L(x) by coefficients of R(x) to generate coefficients of a polynomial product of the form $S(x) = S1(x) + S2(x)$ such that the last r coefficients of S1(x) are zero and deg S2(x)=r−1, where x is the variable of the polynomial, k is the number of data symbols, r is the number of parity symbols, u is a delay, m is the number of symbols in L(x), and g(x) is a generator polynomial of the code (Step 302). Subsequently, we add the first polynomial product component $S_1(x) \times x^{-r}$ to the data polynomial D(x) prior to generating a first parity sequence for the sum $D(x) + S_1(x) \times x^{-r}$ during a data transmission phase for a first k symbols of the codeword (Step 303). Finally, we add the second polynomial product $S_2(x)$ directly to the first parity sequence during a parity transmission phase for the last r symbols of the codeword to generate the final parity sequence Q(x) (Step 304).

We now summarize various aspects of embodiments of the invention. In one aspect the invention provides a method for generating a parity symbol sequence of a code. This method includes the steps of: receiving a sequence representing an m-symbol address and a sequence of k data symbols; multiplying the sequence representing an m symbol address by a set of multiplier symbols to generate a first sequence of product symbols that is equal to the sum of a first sequence and a second sequence wherein the last r coefficients of the first sequence are zero and the degree of the second sequence is one less than the number of parity symbols; adding the first sequence of product symbols to the data sequence prior to generating a first parity sequence for the sum of the data sequence plus the first sequence during a data transmission phase for the first k symbols of the codeword; and adding the second sequence directly to the first parity sequence during a parity transmission phase for a number of symbols at the end of the codeword to generate the final parity sequence.

This method may also additionally provide for generating parity symbol sequence Q(x) of a cyclic code, when the sequence representing the m-symbol address comprises a sequence of values as coefficients of a polynomial representation of an m-symbol block address L(x); the sequence of k data symbols comprises a sequence of values as coefficients of a polynomial representation of data D(x) having k symbols; the sequence of multiplier symbols comprises coefficients of a polynomial of the form $R(x)=x^{m+r-1+u}$ mod $g(x)$, where x is the variable of the polynomial, k is the number of data symbols, r is the number of parity symbols, u is a delay, m is the number of symbols in $L(x)$, and $g(x)$ is a generator polynomial of the code; the first sequence of product symbols comprise coefficients of a polynomial product of the form:

$$S(x)=L(x) \times R(x) \times x^{k-m-u+1}=L(x) \times x^{m+r-1+u} \bmod g(x) \times x^{k-m-u+1}=S_1(x)+S_2(x)$$

such that the last r coefficients of $S_1(x)$ are zero and deg $S_2(X)=r-1$; and further the step of adding the first sequence without last zero symbols to the data sequence comprise the step of adding the first polynomial product component $S_1(x) \times x^{-r}$ to the data polynomial $D(x)$ prior to generating a first parity sequence for the sum $D(x)+S_1(x) \times x^{-r}$ during a data transmission phase for a first k symbols of the codeword; and the step of adding the second sequence directly to the first parity sequence comprise the step of adding the second polynomial product $S_2(x)$ directly to the first parity sequence during a parity transmission phase for the last r symbols of the codeword to generate the final parity sequence $Q(x)$.

In another aspect the method for generating a parity symbol sequence of a code, further comprises a step of generating a syndrome symbol sequence from the readback sequence which includes the final parity sequence.

In another aspect the method for generating a parity symbol sequence of a code further comprises a step of generating a syndrome symbol sequence, and includes steps of: receiving a sequence representing an m-symbol address estimation which may not be equal to the sequence representing an m-symbol address and a readback sequence of k+r data and parity symbols, some of which may be in error; multiplying the sequence representing an m-symbol address estimation by a set of multiplier symbols to generate a second sequence of product symbols which will be identical to the first sequence of product symbols if m-symbol address estimation sequence is equal to the m-symbol address sequence; adding the second sequence of product symbols to the readback sequence to generate a sum sequence; and generating syndromes for the sum sequence.

In other aspects the method for generating a syndrome symbol sequence may be performed when: the sequence representing the m-symbol address estimation comprises a sequence of values as coefficients of a polynomial representation of an m-symbol block address $L'(x)$; the readback sequence of k+r data and parity symbols comprises a sequence of values as coefficients of a polynomial representation of a data estimation $D'(x)$ of the data $D(x)$ having k symbols, and a parity estimation $Q'(x)$ of the parity $Q(x)$ having r symbols, where $D'(x)$ may differ from $D(x)$, and $Q'(x)$ may differ from $Q(x)$; the sequence of multiplier symbols comprises coefficients of a polynomial of the form $R(x)=x^{m+r-1+u}$ mod $g(x)$, where x is the variable of the polynomial, k is the number of data symbols, r is the number of parity symbols, u is a delay, m is the number of symbols in $L'(x)$, and $g(x)$ is a generator polynomial of the code; the second sequence of product symbols comprise coefficients of a polynomial product of the form:

$$S'(x)=L'(x) \times R(x) \times x^{k-m-u+1}=L'(x) \times x^{m+r-1+u} \bmod g(x) \times x^{k-m-u+1}=S'_1(x)+S'_2(x)$$

such that the last r coefficients of $S'_1(x)$ are zero and deg $S'_2(x)=r-1$; and the step of adding the second sequence of product symbols to the readback sequence comprise the steps of: (i) adding a first component of the second sequence of product symbols $S'_1(x)$ multiplied by $x^{-r}$ to the data estimation $D'(x)$; and (ii) adding a second component of the second sequence of product symbols $S'_2(x)$ to the parity estimation $Q'(x)$.

In another aspect the invention provides a method for incorporating a storage device block address into a codeword so that upon readback from the storage device a block address error is distinguishable from an uncorrectable data error and the block address can be recovered from the readback data. This method includes steps of:prepending block address information to free positions at the beginning of a cyclic codeword; computing parity on the basis of both the block address information and user data; during a write operation, writing the user data and the computed parity to the storage device but not writing the block address to the storage device; during a read operation, reading the user data and the computed parity from the storage device and computing syndromes for or based on the user data and the computed parity with prepended estimated block address information; calculating error vector based on the syndromes and if there are non-zero components in the positions corresponding to the prepended block address correcting the block address to recover a correct block address.

Another aspect of the invention provides an error correcting code encoder/decoder apparatus that includes: a parity/syndrome generator for generating parity during an encoding operation and syndromes during a decoding operation; a polynomial multiplier for multiplying m address symbols by a set of multiplier symbols to generate a sequence of product symbols that are equal to the sum of a first sequence and a second sequence wherein the last r coefficients of the first sequence are zero and the degree of the second sequence is one less than the number of parity symbols; a first adder adding the first sequence to the data sequence prior to generating a first parity sequence for the sum of the data sequence plus the first sequence during a data transmission phase for the first k symbols of the codeword; and a second adder adding the second sequence directly to the first parity sequence during a parity transmission phase for a number of symbols at the end of the codeword to generate the final parity sequence.

The inventive method may be practiced where the cyclic code comprises a systematic cyclic Reed-Solomon code.

In another aspect, the invention provides an apparatus for generating a parity symbol sequence of a code. The apparatus includes: a multiplier circuit for multiplying a sequence representing an m symbol address by a set of multiplier symbols to generate a first sequence of product symbols that is equal to the sum of a first sequence and a second sequence wherein the last r coefficients of the first sequence are zero and the degree of the second sequence is one less than the number of parity symbols; a first adder for adding the first sequence of product symbols to a data sequence having k data symbols prior to generating a first parity sequence for the sum of the data sequence plus the first sequence during a data transmission phase for the first k symbols of the codeword; and a second adder for adding the second sequence directly to the first parity sequence during a parity transmission phase for a number of symbols at the end of the codeword to generate the final parity sequence.

In another aspect the apparatus for generating a parity symbol sequence of a code further includes: the sequence representing the m-symbol address comprises a sequence of values as coefficients of a polynomial representation of an m-symbol block address $L(x)$; the sequence of k data symbols comprises a sequence of values as coefficients of a polynomial representation of data D(x) having k symbols; the sequence of multiplier symbols comprises coefficients of a polynomial of the form $R(x)=x^{m+r-1+u}$ mod g(x), where x is the variable of the polynomial, k is the number of data symbols, r is the number of parity symbols, u is a delay, m is the number of symbols in L(x), and g(x) is a generator polynomial of the code; the first sequence of product symbols comprise coefficients of a polynomial product of the form:

$$S(x)=L(x)\times R(x)\times x^{k-m-u+1}=L(x)\times x^{m+r-1+u} \bmod g(x)\times x^{k-m-u+1}=S_1(x)+S_2(x)$$

such that the last r coefficients of $S_1(x)$ are zero and deg $S_2(x)=r-1$; the first adder adds the first polynomial product component $S_1(x)\times x^{-r}$ to the data polynomial D(x) prior to generating a first parity sequence for the sum $D(x)+S_1(x)\times x^{-r}$ during a data transmission phase for a first k symbols of the codeword; and the second adder adds the second polynomial product $S_2(x)$ directly to the first parity sequence during a parity transmission phase for the last r symbols of the codeword to generate the final parity sequence Q(x).

For those workers having ordinary skill in the art, it will be clear from the context that certain arithmetic operations are modulo 2, while other aritmetic operations are regular non-modulo operations.

It is to be understood that even though numerous characteristics and advantages of various embodiments of the present invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the ECC encoder/decoder, data storage system, or computer while maintaining substantially the same functionality without departing from the scope and spirit of the present invention. In addition, although the preferred embodiment described herein is directed to a ECC encoder/decoder for a data storage system having an ECC encoder/decoder and polynomial multiplier, it will be appreciated by those skilled in the art that the teachings of the present invention can be applied to other systems, like generic data storage devices and systems, data transmission devices and systems, or communication systems, without departing from the scope and spirit of the present invention.

All publications, patents, and patent applications mentioned in this specification are herein incorporated by reference to the same extent as if each individual publication or patent application was specifically and individually indicated to be incorporated by reference.

What is claimed is:

1. A method for generating a parity symbol sequence of a code, said method comprising the steps of:
   (a) receiving a sequence representing an m-symbol address and a data sequence of k data symbols:
   (b) multiplying said sequence representing an m-symbol address by a set of multiplier symbols to generate a first sequence of product symbols that is equal to the sum of a first polynomial product sequence and a second polynomial product sequence wherein the last r coefficients of the first polynomial product sequence are zero and the degree of the second polynomial product sequence is one less than the number of parity symbols;
   (c) adding said first sequence of product symbols to said data sequence of k data symbols prior to generating a first parity sequence for the sum of the data sequence of k data symbols plus the first polynomial product sequence during a data transmission phase for the first k symbols of the codeword; and
   (d) adding said second polynomial product sequence directly to said first parity sequence during a parity transmission phase for a number of symbols at the end of the codeword to generate the final parity sequence.

2. The method in claim 1, wherein said method generates a parity symbol sequence Q(x) of a cyclic code; and wherein:
   said sequence representing said m-symbol address comprises a sequence of values as coefficients of a polynomial representation of an m-symbol block address L(x);
   said data sequence of k data symbols comprises a sequence of values as coefficients of a polynomial representation of data D(x) having k symbols;
   said sequence of multiplier symbols comprises coefficients of a polynomial of the form $R(x)=x^{m+r-1+u}$ mod g(x), where x is the variable of the polynomial, k is the number of data symbols, r is the number of parity symbols, u is a delay, m is the number of symbols in L(x), and g(x) is a generator polynomial of said code;
   said first sequence of product symbols comprise coefficients of a polynomial product of the form:

$$S(x)=L(x)\times R(x)\times x^{k-m-u+1}=L(x)\times x^{m+r-1+u} \bmod g(x)\times x^{k-m-u+1}=S_1(x)+S_2(x)$$

such that the last r coefficients of $S_1(x)$ are zero and deg $S_2(x)=r-1$;
   said step (c) of adding said first polynomial product sequence without last zero symbols to said data sequence of k data symbols comprise the step of adding said first polynomial product component $S_1(x)\times x^{-r}$ to said data polynomial D(x) prior to generating, a first parity sequence for the sum $D(x)+S_1(x)\times x^{-r}$ during a data transmission phase for a first k symbols of the codeword; and
   said step (d) of adding said second polynomial product sequence directly to said first parity sequence comprise the step of adding said second polynomial product $S_2(x)$ directly to said first parity sequence during a parity transmission phase for the last r symbols of the codeword to generate the final parity sequence Q(x).

3. The method in claim 2, wherein said cyclic code, from which the parity symbol sequence Q(x) is generated, comprises a systematic cyclic Reed-Solomon code.

4. The method of claim 1, further comprising a step of generating a syndrome symbol sequence from a readback sequence of readback data which includes said final sequence.

5. The method in claim 1, further comprising a step of generating a syndrome symbol sequence, comprising steps of:
   (e) receiving a sequence representing an m-symbol address estimation which may not be equal to said sequence representing an m-symbol address and a readback sequence of k+r data and parity symbols, some of which may be in error;
   (f) multiplying said sequence representing an m-symbol address estimation by a set of multiplier symbols to generate a second sequence of product symbols which

19 will be identical to said first sequence of product symbols if m-symbol address estimation sequence is equal to said m-symbol address sequence, (g) adding said second sequence of product symbols to a readback sequence of readback data to generate a sum sequence; and (h) generating syndromes for said sum sequence.

6. The method in claim 5, wherein:

said sequence representing said m-symbol address estimation comprises a sequence of values as coefficients of a polynomial representation of an m-symbol block address L'(x);

said readback sequence of k+r data and parity symbols comprises a sequence of values as coefficients of a polynomial representation of a data estimation D'(x) of said data D(x) having k symbols, and a parity estimation Q'(x) of said parity Q(x) having r symbols, where D'(x) may differ from D(x), and Q'(x) may differ from Q(x);

said sequence of multiplier symbols comprises coefficients of a polynomial of the form $R(x)=^{m+r-1+u}$ mod g(x), where x is the variable of the polynomial, k is the number of data symbols, r is the number of parity symbols, u is a delay, m is the number of symbols in L'(x), and g(x) is a generator polynomial of said code;

said second sequence of product symbols comprise coefficients of a polynomial product of the form:

$$S'(x)=L'(x)\times R(x)\times x^{k-m-u+1}=L'(x)\times x^{m+r-1+u\ mod}g(x)\times x^{k-m-u+1}=S'_1(x)+S'_2(x)$$

such that the last r coefficients of $S'_1(x)$ are zero and deg $S'_2(x)=r-1$;

said step of adding said second sequence of product symbols to said readback sequence comprise the steps of:

(i) adding, a first component of said second sequence of product symbols $S'_1(x)$ multiplied by $x^{-r}$ to said data estimation D'(x): and (ii) adding a second component of said second sequence of product symbols $S'_2(x)$ to said parity estimation Q'(x).

7. An error correcting code encoder/decoder comprising:

a parity/syndrome generator for generating parity during an encoding operation and syndromes during a decoding operation;

a polynomial multiplier for multiplying address symbols by a set of multiplier symbols to generate a sequence of product symbols that are equal to the sum of a first polynomial product sequence and a second polynomial product sequence wherein the last r coefficients of the first polynomial product sequence are zero and the degree of the second polynomial product sequence is one less than the number of parity symbols;

a first adder adding said first polynomial product sequence to a data sequence of k data symbols prior to generating a first parity sequence for the sum of the data sequence of k data symbols plus the first polynomial product sequence during a data transmission phase for the first k symbols of the codeword; and

20 a second adder adding said second polynomial product sequence directly to said first parity sequence during a parity transmission phase for a number of symbols at the end of the codeword to generate the final parity sequence.

8. A apparatus for generating a parity symbol sequence of a code comprising:

a multiplier circuit for multiplying a sequence representing an m-symbol address by a set of multiplier symbols to generate a first sequence of product symbols that is equal to the sum of a first polynomial product sequence and a second polynomial product sequence wherein the last r coefficients of the first polynomial product sequence are zero and the degree of the second polynomial product sequence is one less than the number of parity symbols;

a first adder for adding said first polynomial product sequence of product symbols to a data sequence having k data symbols prior to generating a first parity sequence for the sum of the data sequence having k data symbols plus the first polynomial product sequence during a data transmission phase for the first k symbols of the codeword; and a second adder for adding said second polynomial product sequence directly to said first parity sequence during a parity transmission phase for a number of symbols at the end of the codeword to generate the final parity sequence.

9. The apparatus in claim 8, wherein:

said sequence representing said m-symbol address comprises a sequence of values as coefficients of a polynomial representation of an m-symbol block address L(x);

said data sequence of k data symbols comprises a sequence of values as coefficients of a polynomial representation of data D(x) having k symbols;

said set of multiplier symbols comprises coefficients of a polynomial of the form $R(x)=x^{m+r-1+1+u}$ mod g(x), where x is the variable of the polynomial, k is the number of data symbols, r is the number of parity symbols, u is a delay, m is the number of symbols in L(x), and g(x) is a generator polynomial of said code;

said first sequence of product symbols comprise coefficients of a polynomial product of the form:

$$S(x)=L(x)\times R(x)\times x^{k-m-u+1}=L(x)=x^{m+r-1+u\ mod}g(x)\times x^{k-m-u+1}=S_1(x)+S_2(x)$$

such that the last r coefficients of $S_1(x)$ are zero and deg $S_2(x)=r-1$;

said first adder adds said first polynomial product component $S_1(x)\times x^{-r}$ to said data polynomial D(x) prior to generating a first parity sequence for the sum $D(x)+S_1(x)\times x^{-r}$ during a data transmission phase for a first k symbols of the codeword; and said second adder adds said second polynomial product $S_2(x)$ directly to said first parity sequence during a parity transmission phase for the last r symbols of the codeword to generate the final parity sequence Q(x).

* * * * *